(12) United States Patent
Cader

(10) Patent No.: US 6,996,996 B1
(45) Date of Patent: Feb. 14, 2006

(54) SEALED SPRAY COOLING SYSTEM

(75) Inventor: Tahir Cader, Pullman, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 0 days.

(21) Appl. No.: 10/406,785

(22) Filed: Apr. 2, 2003

Related U.S. Application Data

(63) Continuation-in-part of application No. 10/243,683, filed on Sep. 13, 2002, and a continuation-in-part of application No. 10/371,403, filed on Feb. 19, 2003.

(51) Int. Cl.
*F25D 17/02* (2006.01)
*F25D 23/12* (2006.01)
*B05B 1/24* (2006.01)
*H01L 23/34* (2006.01)

(52) U.S. Cl. .................... 62/118; 62/259.2; 239/132.5; 257/715

(58) Field of Classification Search ............... 62/118, 62/119, 132, 171, 64, 259.2; 165/104.33, 165/908; 236/75; 239/132.5; 257/715; 361/699, 689, 698, 719, 721
See application file for complete search history.

(56) References Cited

U.S. PATENT DOCUMENTS

| | | | |
|---|---|---|---|
| 5,220,804 A | 6/1993 | Tilton et al. ............... 62/64 |
| 5,349,831 A * | 9/1994 | Daikoku et al. .............. 62/376 |
| 6,095,083 A * | 8/2000 | Rice et al. ................. 118/723 I |
| 6,108,201 A | 8/2000 | Tilton et al. ................ 361/689 |
| 6,317,326 B1 | 11/2001 | Vogel et al. ................ 361/704 |
| 6,389,225 B1 | 5/2002 | Malinoski et al. .......... 392/479 |
| 6,508,301 B1 | 1/2003 | Marsala ..................... 165/80.4 |
| 6,544,338 B1 * | 4/2003 | Batchelder et al. ......... 118/641 |

* cited by examiner

*Primary Examiner*—Chen Wen Jiang
(74) *Attorney, Agent, or Firm*—Michael S. Neustel

(57) ABSTRACT

A sealed spray cooling system for reducing coolant loss within thermal management systems. The sealed spray cooling system includes a spray housing defining a spray chamber having at least one atomizer and a seal member attached to the spray housing about the spray chamber for sealing against a semiconductor forming a sealed spray area. Alternatively, the spray unit is comprised of a first member, a second member having at least one atomizer, the second member pivotally attached to the first member forming an interior cavity between thereof, and a seal member attached to the second member for sealing against a semiconductor within the first member thereby forming a sealed spray area. A vacuum manifold is preferably fluidly connected to the spray cavity thereby reducing the pressure within the spray cavity.

20 Claims, 7 Drawing Sheets

SEALED SPRAY COOLING SYSTEM

CROSS REFERENCE TO RELATED APPLICATIONS

I hereby claim benefit under Title 35, United States Code, Section 120 of U.S. patent application Ser. No. 10/243,683 filed Sep. 13, 2002 entitled "Semiconductor Burn-In Thermal Management System" and Ser. No. 10/371,403 filed on Feb. 19, 2003 "Coolant Recovery System". This application is a continuation-in-part of the Ser. Nos. 10/243,683 and 10/371,403 applications. The Ser. Nos. 10/243,683 and 10/371,403 applications are currently pending. The Ser. Nos. 10/243,683 and 10/371,403 applications are hereby incorporated by reference into this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to electronics cooling systems and more specifically it relates to a sealed spray cooling system for reducing coolant loss within thermal management systems.

2. Description of the Related Art

Thermal management systems for electronic systems have been in use for years. Thermal management systems are used in various applications such as but not limited to semiconductor burn-in, server computers, personal computers and workstations, rack mount servers, diagnostics, and large telecommunications and computing facilities. Conventional thermal management systems utilized today are comprised of, for example, either air-cooled enclosures, or fluid-cooled cold plates. Upcoming technologies include refrigeration systems or other two-phase based technologies.

Modern electronic devices have increased thermal management requirements. Spray cooling is being adopted today as the most efficient option for thermally managing electronic systems. U.S. Pat. No. 5,220,804 entitled High Heat Flux Evaporative Spray Cooling to Tilton et al. describes the earlier versions of spray cooling technology. U.S. Pat. No. 6,108,201 entitled Fluid Control Apparatus and Method for Spray Cooling to Tilton et al. also describes the usage of spray cooling technology to cool a printed circuit board. Spray cooling may be performed locally (i.e. where the chip is sprayed directly), globally (i.e. where the chip and surrounding electronics/boards are also sprayed), a combination of locally and globally, or in conjunction with air cooling or other cooling methods.

Various methods of spray cooling thermal management may be employed for semiconductors and other electronic devices. For adequately low heat fluxes, it may be appropriate to cool the electronic devices through purely forced convection (i.e. no effective evaporation of the coolant occurs). For intermediate heat fluxes, it may be appropriate to utilize a combination of forced convection and phase change heat transfer (i.e. the latter method resulting in evaporation of the coolant). For the highest level of heat fluxes, it may be appropriate to optimize purely on phase change heat transfer. Expensive dielectric coolants are commonly utilized liquid coolants in spray cooling thermal management systems today, thereby making vapor recovery increasingly important.

For cold plates that are in direct contact with the electronic devices being cooled, it is of paramount importance that the cold plate makes uniform contact with the device. For a given device, non-uniform contact leads to elevated junction temperatures, and large thermal gradients across the device. For an application such as the burn-in of multiple semiconductor devices, such non-uniform contact also creates unacceptable thermal gradients across the batch (leads to large junction temperature spread). Current equipment employs actuation systems that place the cold plates in physical contact with the devices to be cooled. To ensure uniform contact between the cold plates and devices, the actuation systems employ gimbaling mechanisms that allow the cold plate to float on a sort of ball and socket joint, and that allow it to seat relatively well. Specific embodiments of the present invention are highly tolerant of poor seating which negates the need for the expensive and cumbersome gimbaling mechanisms. The vacuum maintained within the spray cavity ensures that if a seal structure is not well seated, there is no danger of additional coolant loss.

In most spray cooling applications, a certain volume of coolant is changed to vapor. When the equipment being cooled needs to be accessed, for example, for maintenance, there is the chance that such vapor could be lost to the atmosphere. In a burn-in application, it is critical to rapidly remove the burn-in boards to reduce costly equipment downtime. Another example is the thermal management of servers employed in data centers, wherein the processors or entire servers may need to be removed for maintenance. In any application of spray cooling thermal management, coolant vapor loss is a significant issue. Hence, there is a need for technology that will mitigate the volume of coolant loss in a spray cooling thermal management system.

While conventional thermal management systems may be suitable for the particular purpose to which they address, they are not as suitable for reducing coolant loss. Conventional spray cooling thermal management systems may have significant coolant vapor loss, which would increase the thermal management costs.

In these respects, the sealed spray cooling system according to the present invention substantially departs from the conventional concepts and designs of the prior art, and in so doing provides a system primarily developed for the purpose of reducing coolant loss within thermal management systems.

BRIEF SUMMARY OF THE INVENTION

In view of the foregoing disadvantages inherent in the known types of thermal management systems now present in the prior art, the present invention provides a new sealed spray cooling system construction wherein the same can be utilized for reducing coolant loss within thermal management systems.

The general purpose of the present invention, which will be described subsequently in greater detail, is to provide a new sealed spray cooling system that has many of the advantages of the thermal management systems mentioned heretofore and many novel features that result in a new sealed spray cooling system which is not anticipated, rendered obvious, suggested, or even implied by any of the prior art semiconductor burn-in systems, either alone or in any combination thereof.

To attain this, the present invention generally comprises a spray housing defining a spray chamber having at least one atomizer and a seal member attached to the spray housing about the spray chamber for sealing against a surface forming a sealed spray area. Alternatively, the spray unit is comprised of a first member, a second member having at least one atomizer, the second member attached to the first member forming an interior cavity between thereof, and a seal member attached to the second member for sealing against a semiconductor within the first member thereby forming a sealed spray area. A vacuum manifold is preferably fluidly connected to the spray cavity thereby reducing the pressure within the spray cavity, thereby assisting in reduced coolant and vapor loss.

There has thus been outlined, rather broadly, the more important features of the invention in order that the detailed description thereof may be better understood and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a sealed spray cooling system that will overcome the shortcomings of the prior art devices.

A second object is to provide a sealed spray cooling system that reduces coolant loss within thermal management systems.

Another object is to provide a sealed spray cooling system that reduces the costs of operating a thermal management system utilizing coolant.

A further object is to provide a sealed spray cooling system that can be utilized to retrofit existing thermal management systems.

Another object is to provide a sealed spray cooling system that allows for the preloading of semiconductors onto a burn-in board and the removal of the burn-in board for efficient coolant recovery.

An additional object is to provide a sealed spray cooling system that is energy efficient and flexible.

A further object is to provide a sealed spray cooling system that may be utilized within standalone or central thermal management systems.

Another object is to provide a sealed spray cooling system that may be utilized with local or global spray cooling applications, combinations of local/global spray cooling applications, and combinations of spray cooling with air cooling.

Another object is to provide a sealed spray cooling system that may be utilized with actuation mechanisms that are typically used to engage prior art thermal management solutions with the electronic devices to be thermally managed.

A further object is to provide a sealed spray cooling system that is highly tolerant of poor seating thereby negating the need for the expensive and cumbersome gimbaling mechanisms.

Another object is to provide a sealed spray cooling system that utilizes a vacuum within the spray cavity to ensure that if a seal structure is not well seated, there is no danger of additional coolant loss.

A further object is to provide a sealed spray cooling system that may be utilized within a single module tester (SMT) environment where the semiconductor's temperature may have to be maintained at a constant or varying level in response to power cycling of the semiconductor.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1:
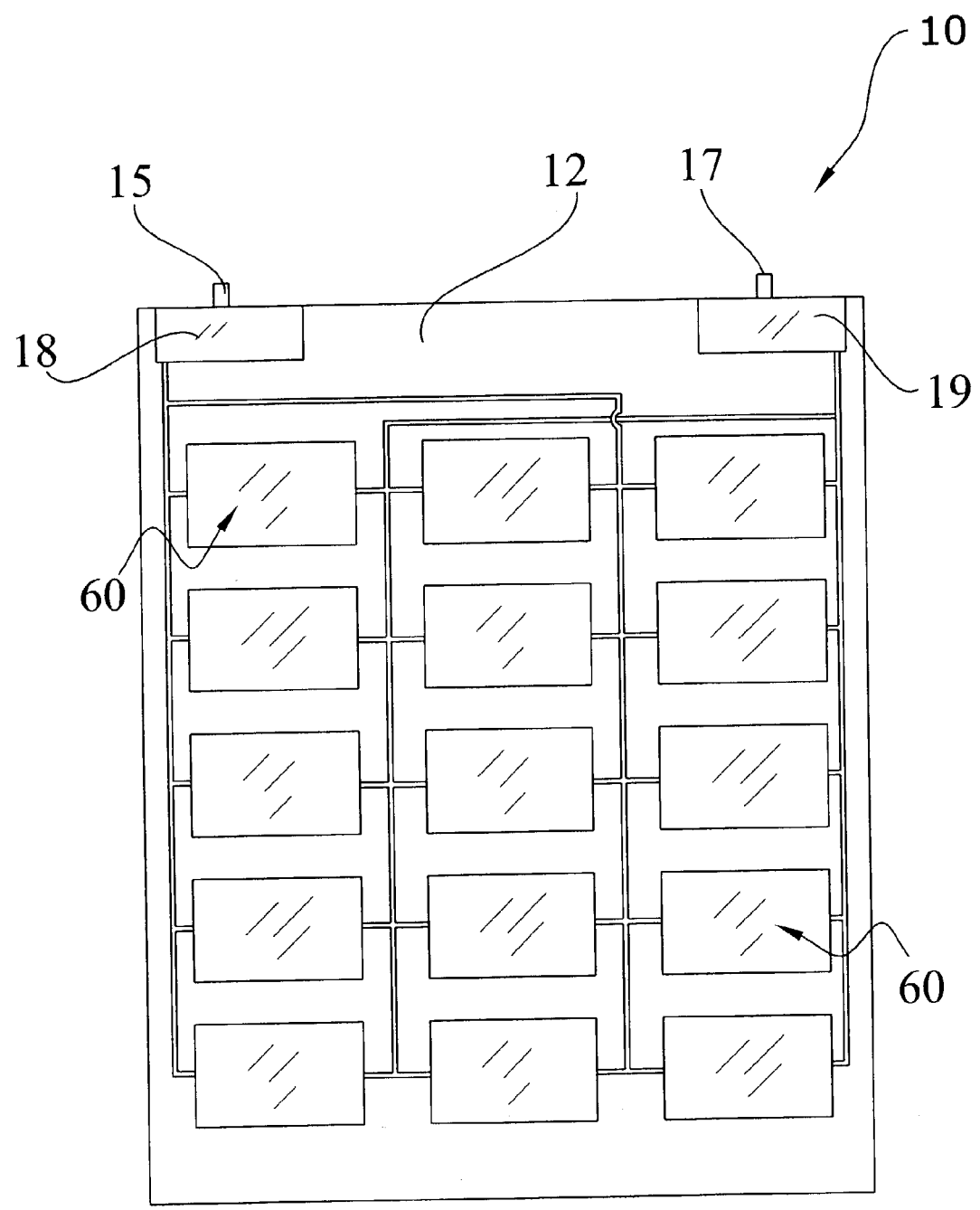
FIG. 1 is a top view of a burn-in board with the spray units fluidly mounted upon thereof.

Turning now descriptively to the drawings, in which similar reference characters denote similar elements throughout the several views, FIGS. 1 through 5 illustrate a sealed spray cooling system 10, which comprises one or more spray units 60 attachable to a burn-in board 12 or mounted in some other manner. The spray units 60 each preferably are comprised of a housing defining a spray chamber having at least one atomizer 75 and a seal structure 62 attached to the housing about the spray cavity 64 for sealing against a semiconductor 14 forming the sealed spray cavity 64. Alternatively, each spray unit 60 is comprised of an upper member 70 having at least one atomizer 75, a lower member 72 pivotally attached to the upper member 70 forming a spray area 77 between thereof, and a seal member 78 attached to the upper member 70 for sealing against a semiconductor 14 within the lower member 72 thereby forming a sealed spray area 77. A vacuum manifold 66 is preferably fluidly connected to the spray cavity 64 thereby reducing the pressure within the spray cavity 64. The spray unit 60 may be utilized in various applications such as but not limited to semiconductor 14 burn-in, server computers, personal computers and workstations, rack mount servers, diagnostics, and large telecommunications and computing facilities.

B. First Embodiment

Figure 2:
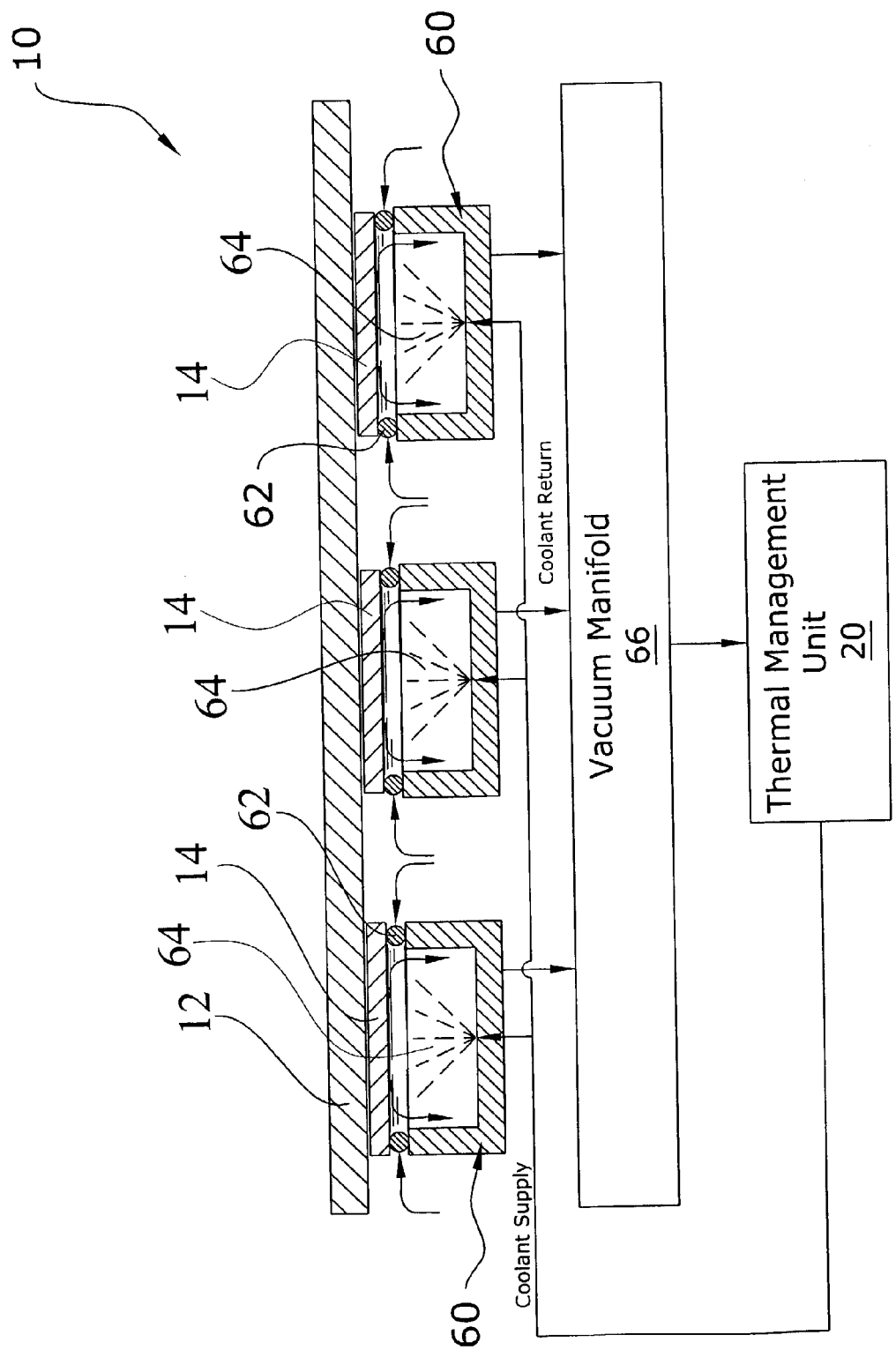
FIG. 2 illustrates a first embodiment of the spray unit.
Figure 3:
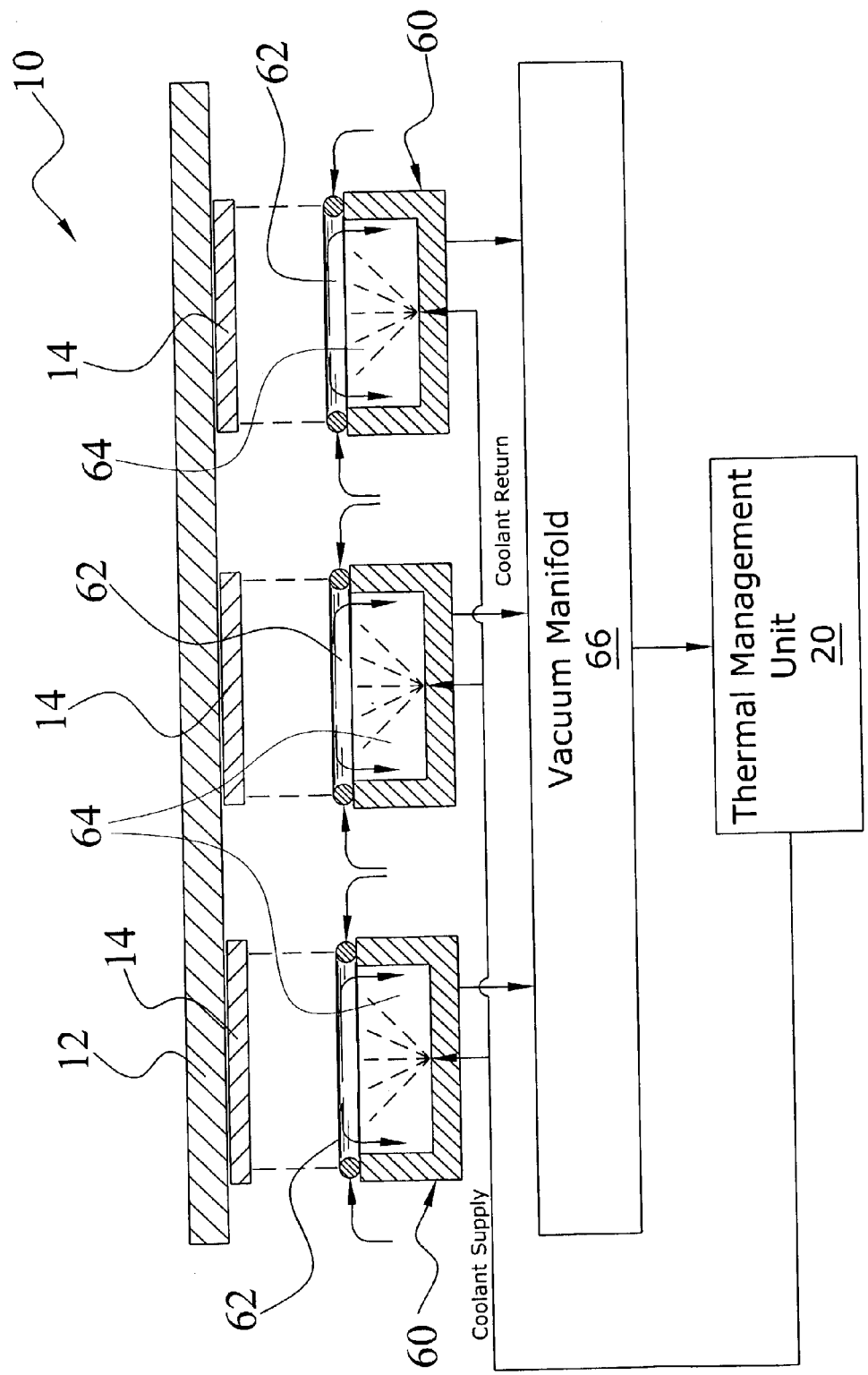
FIG. 3 illustrates the first embodiment of the spray unit removed from the semiconductors.

FIGS. 2 and 3 illustrate a spray unit 60 that has reduced vapor loss. The spray unit 60 utilizes a spray housing for each individual semiconductor 14 that is sealed by a seal structure 62. The seal structure 62 may be comprised of various sealing structures such as O-rings and the like. The seal structure 62 is designed to efficiently seal, for example, on the carrier of a bare device (i.e. does not employ an integrated heat sink), on the integrated heat sink, on the device's socket, or on the printed circuit board to which the device is mounted.

The spray unit 60 may utilize one or more atomizers in various arrangements. The spray unit 60 is designed to continuously deliver coolant to the device being cooled. The spray unit 60 preferably includes an efficient coolant and vapor drainage structure that prevents flooding of the device being cooled thereby ensuring efficient cooling. The structure of the spray unit 60 also prevents vapor/coolant recirculation from creating pressure gradients within the spray unit that could adversely affect delivery of the coolant, as well as the thermal management process. U.S. Pat. No. 5,220,804 is hereby incorporated by reference as providing technology for the spray unit 60.

A vacuum manifold 66 is fluidly connected to each spray housing thereby creating a vacuum within the spray cavity 64 of the spray housings that draws the liquid and vapor coolant from the interior thereof. The vacuum manifold 66 then transfers the vapor and liquid coolant to a thermal management unit 20 for condensing and thermal conditioning of the coolant.

The spray unit 60 of FIGS. 2 and 3 is designed to work with thermal management solution actuation mechanisms currently in use. In this situation, the thermal solution is placed on a hydraulically actuated tray that places the thermal solution in contact with all the devices. The spray units 60 of FIG. 2 are impervious to contact pressure, and are highly tolerant of poor seating that negates the need for the expensive and cumbersome gimbaling mechanisms. The vacuum maintained within the spray cavity 64 ensures that if a seal structure 62 is not well seated, there is no danger of additional coolant loss.

C. Second Embodiment

Figure 4:
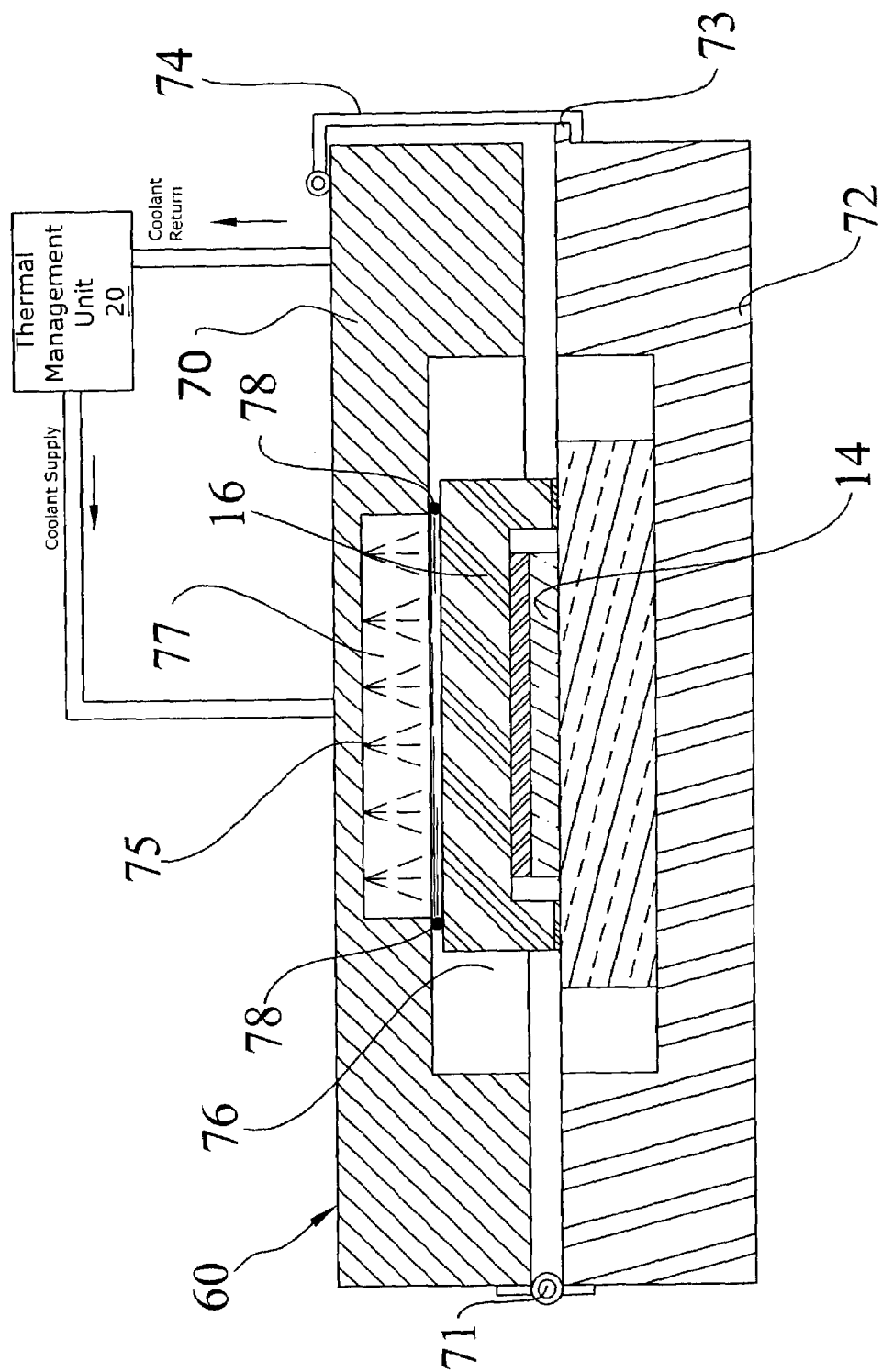
FIG. 4 illustrates a second embodiment of the spray unit.
Figure 5:
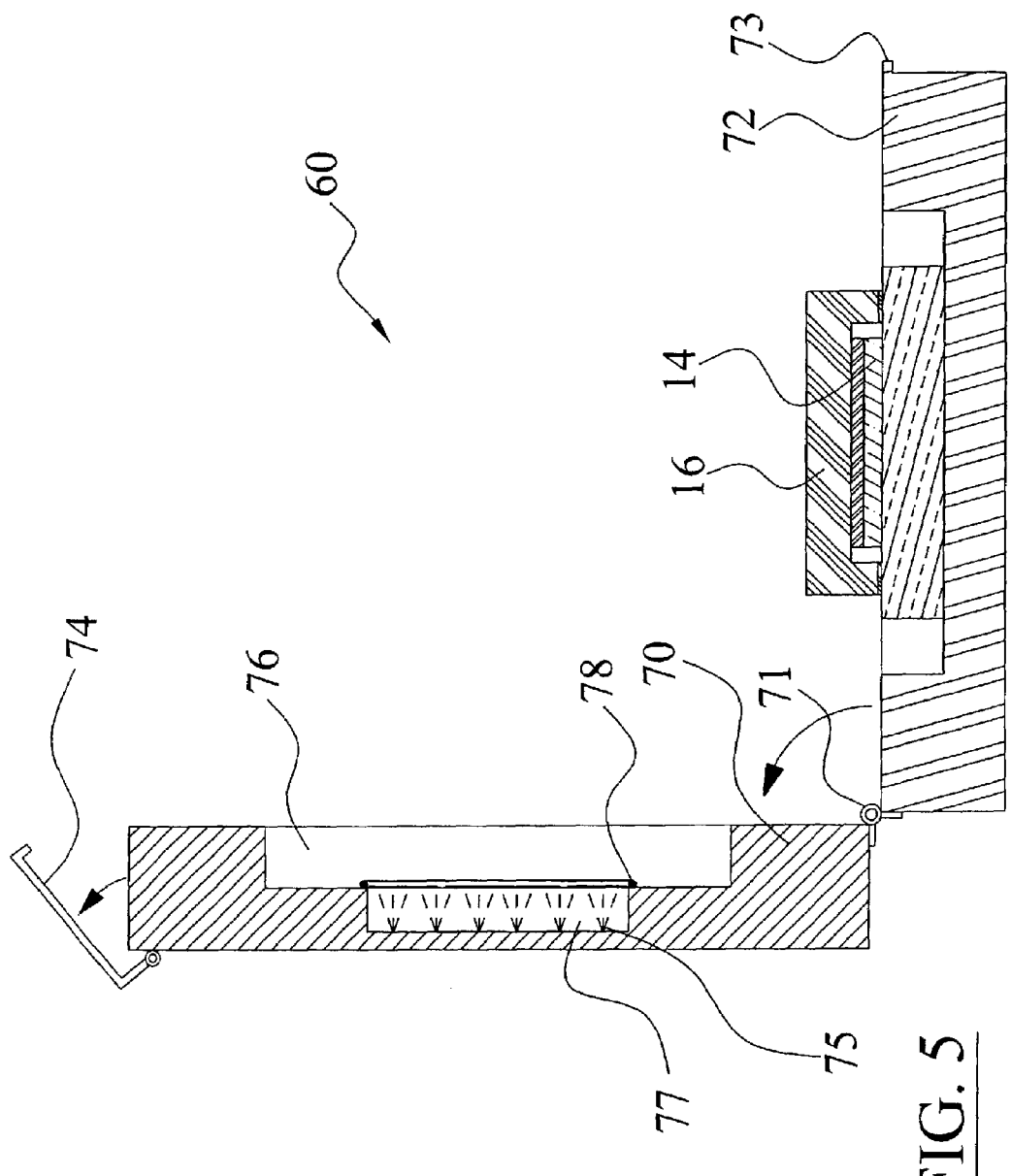
FIG. 5 illustrates the second embodiment of the spray unit with the upper member opened to allow for the insertion or removal of the semiconductor.

FIGS. 4 and 5 illustrate an alternative embodiment of the spray units 60 wherein an upper member 70 and a lower member 72 are pivotally attached by a hinge 71. The upper member 70 and the lower member 72 define an interior cavity 76 that receives the semiconductor 14. The lower member 72 may be comprised of a burn-in socket or other structure. A clip member 74 extending from the upper member 70 or other engaging structure selectively engages a lip 73 of the lower member 72 thereby retaining the upper member 70 adjacent the lower member 72.

The seal member 78 may be comprised of various sealing structures such as O-rings and the like. The seal structure 78 is designed to efficiently seal, for example, on the carrier of a bare device (i.e. does not employ an integrated heat sink), on the integrated heat sink, on the device's socket, or on the printed circuit board to which the device is mounted.

The spray unit 60 may utilize one or more atomizers in various arrangements. The spray unit 60 is designed to continuously deliver coolant to the device being cooled. The spray unit 60 preferably includes an efficient coolant and vapor drainage structure that prevents flooding of the device being cooled thereby ensuring efficient cooling. The structure of the spray unit 60 also prevents vapor/coolant recirculation from creating pressure gradients within the spray unit that could adversely affect delivery of the coolant, as well as the thermal management process.

The upper member 70 defines a spray area 77 about the semiconductor 14 having a heat sink 16 or without a heat sink 16. A seal member 78 is attached to the upper member 70 about the spray area 77 for sealably engaging the surface of integrated heat sink of the semiconductor 14 or other surface. Pressurized coolant from the thermal management unit 20 is sprayed upon the semiconductor 14 through atomizers 75. A coolant return line is fluidly connected to the spray area 77 and thereafter returns the coolant and vapor to the thermal management unit 20 for thermal conditioning.

D. Third Embodiment

Figure 6:
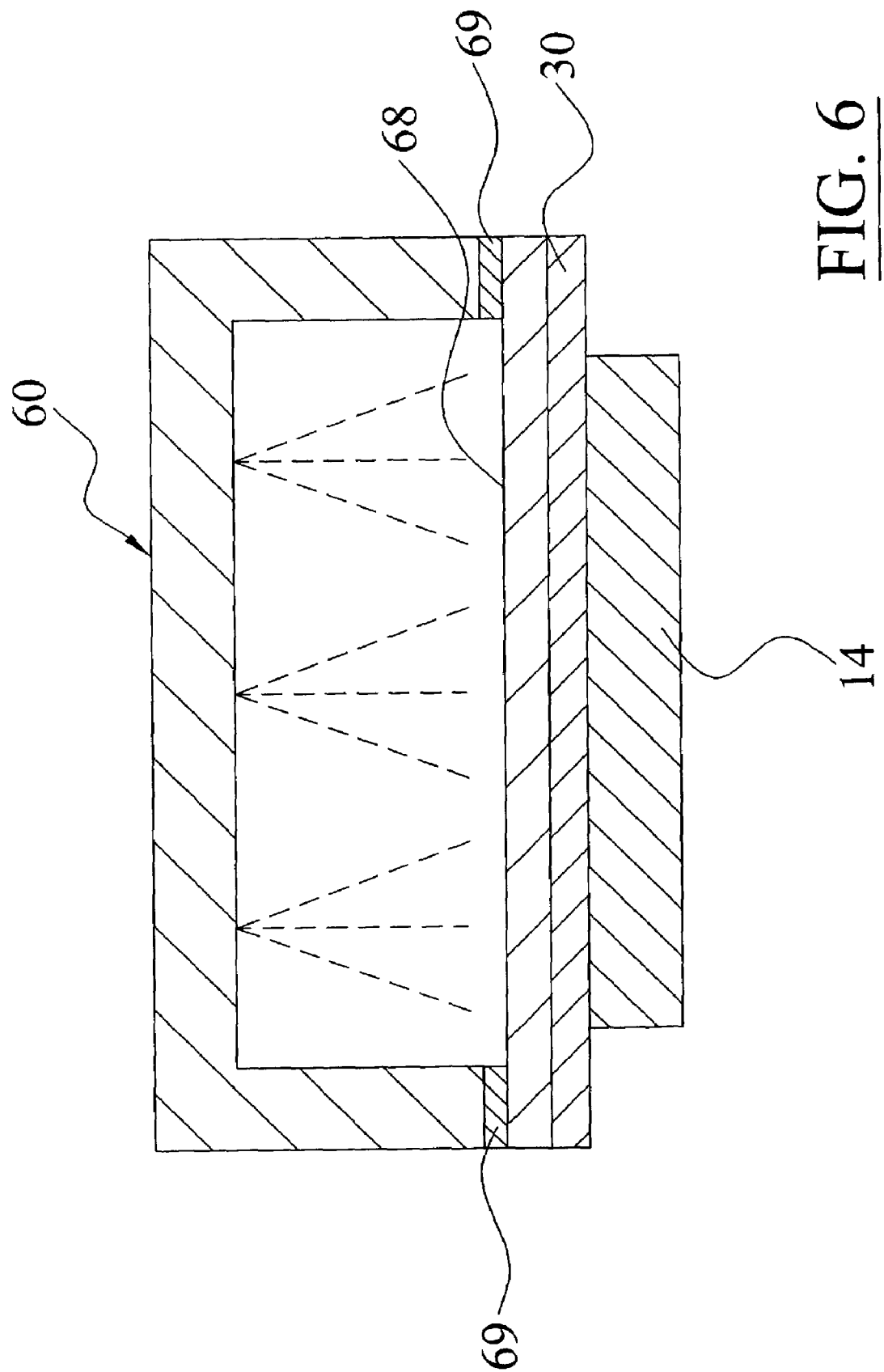
FIG. 6 illustrates a third embodiment of the spray unit comprised of an enclosed structure with a thermally conducting wall.

FIG. 6 illustrates an alternative embodiment of the present invention that is particularly suitable for semiconductor testing procedures. During semiconductor testing procedures, it is often times required to rapidly change the temperature of the semiconductor while adjusting electrical power input into the semiconductor 14. The spray units 60 may be utilized within a single module tester (SMT) environment where the semiconductor's temperature may have to be maintained at a constant or varying level in response to power cycling of the semiconductor 14. In an SMT environment, the semiconductor 14 is simply removed from the spray unit 60.

As shown in FIG. 6 of the drawings the spray unit 60 has an interior spray cavity with at least one atomizer spraying a coolant directly upon a thermally conducting wall 68. The thermally conducting wall 68 may be integrally formed within the spray unit 60 or attached to the spray unit 60 with insulation 69 or other material between thereof to reduce the transfer of heat to the spray unit 60.

The thermally conducting wall 68 is comprised of a material having a high heat transfer capacity. The thermally conducting wall 68 also preferably includes a heating element contained within or attached to an interior/exterior surface of the thermally conducting wall 68 thereby allowing heating of the semiconductor 14. The spray unit 60 also preferably includes a temperature sensor embedded within the thermally conducting wall 68, or placed on the side internal or external to the spray cavity. A thermal interface material 30 may be positioned between the semiconductor 14 and the exterior surface of the thermally conducting wall 68 to assist in the transfer of heat to or from the thermally conducting wall 68 and the semiconductor 14.

The heating element is preferably comprised of electrical heater elements positioned within or on the surface of the thermally conducting wall 68. The thermally conducting wall 68 may also be comprised of an electrically resistive material that generates heat when electric current is passed through the thermally conducting wall 68. The insulation 69 preferably electrically and thermally insulates the thermally conducting wall 68. Various other configurations may be utilized that generate heat within or adjacent to the thermally conducting wall 68 thereby allowing heating of the semiconductor 14.

In use, if the temperature of the semiconductor 14 needs to be increased, the heating element within the thermally conducting wall 68 can be activated thereby increasing the temperature of the semiconductor 14 during testing or other procedures. To lower the temperature of the semiconductor 14, the electricity to the heating element is reduced and the coolant flow through the atomizers within the spray unit 60 is increased to increase the heat conduction through the thermally conducting wall 68. Combinations of the coolant flow rate and electrical heat may be utilized to control the temperature of the semiconductor 14.

E. Fourth Embodiment

Figure 7:
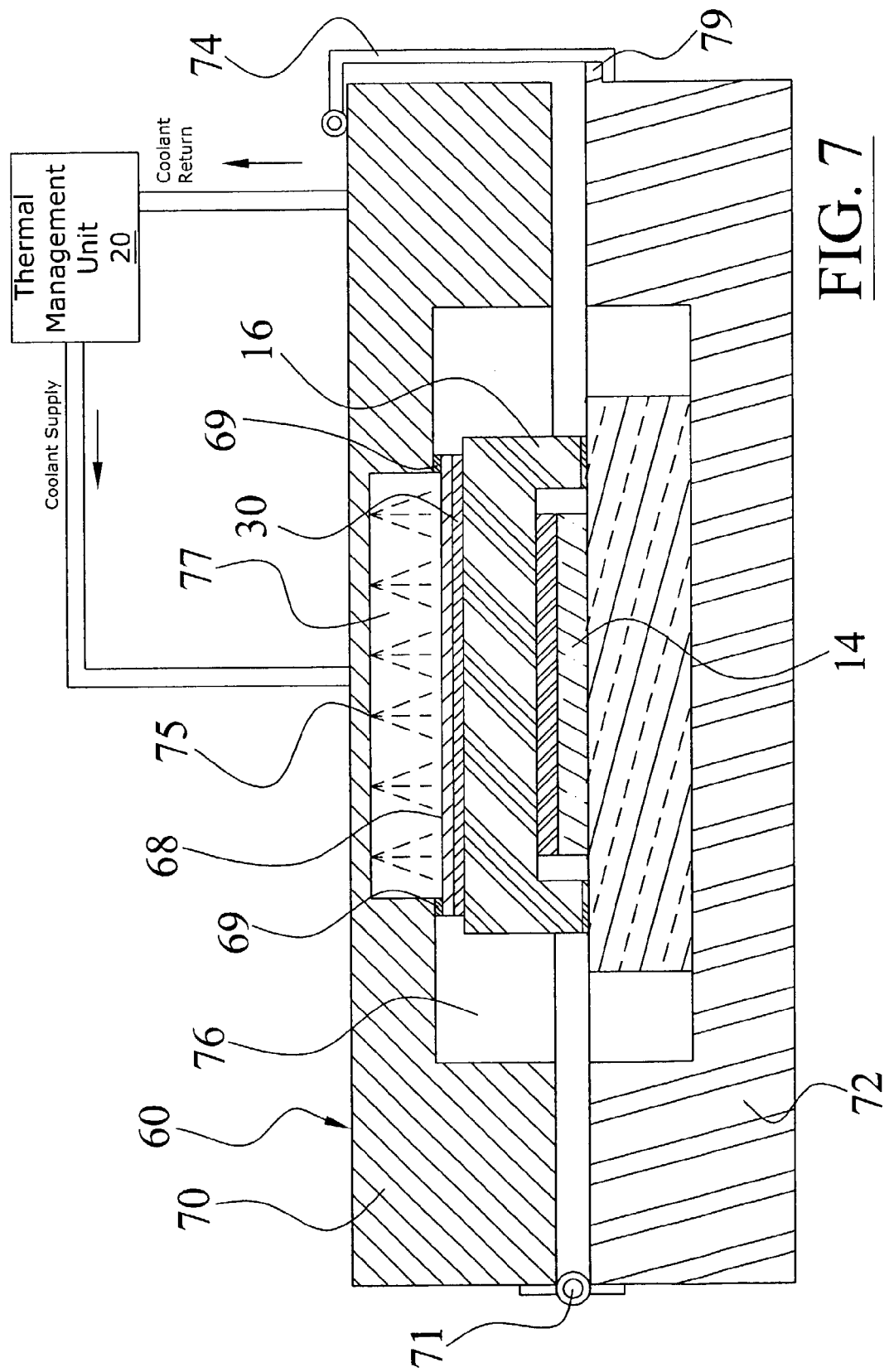
FIG. 7 illustrates a fourth embodiment of the spray unit with a thermally conducting wall utilized to created an enclosed spray area within the second embodiment.

FIG. 7 illustrates a thermally conducting wall 68 attached to the second member 70 forming a sealed spray area 77. The thermally conducting wall 68 is preferably positionable adjacent a surface of a device to be thermally managed as further illustrated in FIG. 7 of the drawings. A thermal interface material 30 may be applied to the device to be thermally managed as further shown in FIG. 7 of the drawings. The above-stated description is hereby incorporated into this section to provide additional support for applications of the fourth embodiment.

F. Burn-In Board

FIG. 1 illustrates an embodiment where the burn-in board 12 has the spray units 60 integrally positioned within. The spray units 60 are fluidly connected to a supply manifold 18 and a return manifold 19 for providing the coolant to the spray units 60.

The supply manifold 18 and the return manifold 19 are fluidly connected to a supply coupler 15 and a return coupler 17 for allowing removable fluid connection with corresponding couplers within the thermal management unit. The couplers 15, 17 are preferably comprised of an automatic self-sealing structure that prevents coolant from passing through the manifolds 18, 19 after removal of the burn-in board 12.

In use, the semiconductors 14 are loaded into the sockets of the burn-in board 12 off-line, then loaded into the burn-in chamber for the purpose of efficiently operating the burn-in unit. After a burn-in cycle or other thermal management process, the fully loaded burn-in board 12 is removed and replaced with a fully pre-loaded burn-in board 12. The first burn-in board 12 may be taken to a vapor recovery station and cycle continued. The spray units 60 may be purged with compressed dry air, nitrogen or other gas capable of purging the coolant from within the spray units 60.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed to be within the expertise of those skilled in the art, and all equivalent structural variations and relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A spray unit for a thermal management system, comprising:
   a base member for receiving and electrically communicating with at least one semiconductor;
   a cover member having at least one atomizer, said cover member pivotally attached to said base member forming an interior cavity between thereof; and
   a seal member attached to said cover member for sealing against a sealing surface thereby forming a sealed spray area.

2. The spray unit for a thermal management system of claim 1, wherein said sealing surface is comprised of a surface of a semiconductor.

3. The spray unit for a thermal management system of claim 1, wherein said sealing surface is comprised of a socket.

4. The spray unit for a thermal management system of claim 1, wherein said sealing surface is comprised of an integrated heat sink.

5. The spray unit for a thermal management system of claim 1, wherein said sealing surface is comprised of a circuit board.

6. The spray unit for a thermal management system of claim 1, wherein said seal member is comprised of a resilient material.

7. The spray unit for a thermal management system of claim 1, wherein said seal member is comprised of an O-ring.

8. The spray unit for a thermal management system of claim 1, including a latch structure for securing said second member to said first member in a closed relationship.

9. The spray unit for a thermal management system of claim 1, including a vacuum unit fluidly connected to said spray chamber.

10. The spray unit for a thermal management system of claim 1, including a thermal management unit fluidly connected to said spray unit.

11. The spray unit for a thermal management system of claim 1, wherein said first member is comprised of a socket.

12. The spray unit for a thermal management system of claim 11, wherein said first member is a component of a burn-in board.

13. A spray unit for a thermal management system, comprising:
   a first member formed for receiving at least one semiconductor;
   a second member having at least one atomizer, said second member-pivotally attached to said first member forming an interior cavity between thereof; and
   a seal member attached to said second member for sealing against a surface of a semiconductor thereby forming a sealed spray area.

14. The spray unit for a thermal management system of claim 13, wherein said seal member is comprised of a resilient material.

15. The spray unit for a thermal management system of claim 13, including a latch structure for securing said second member to said first member in a closed relationship.

16. The spray unit for a thermal management system of claim 13, wherein said first member is comprised of a socket.

17. A spray unit for a thermal management system, comprising:
   a first member formed for receiving at least one semiconductor;

a second member having at least one atomizer, said second member pivotally attached to said first member forming an interior cavity between thereof; and a seal member attached to said second member for sealing against a surface of an integrated heat sink thereby forming a sealed spray area.

18. The spray unit for a thermal management system of claim 17, wherein said seal member is comprised of a resilient material.

19. The spray unit for a thermal management system of claim 17, including a latch structure for securing said second member to said first member in a closed relationship.

20. The spray unit for a thermal management system of claim 17, wherein said first member is comprised of a socket.

* * * * *